US010405128B2

(12) United States Patent
Yamamoto

(10) Patent No.: US 10,405,128 B2
(45) Date of Patent: Sep. 3, 2019

(54) AUDIO PROCESSING DEVICE FOR A CEILING REFLECTION TYPE SPEAKER

(71) Applicant: Onkyo Corporation, Osaka (JP)

(72) Inventor: Susumu Yamamoto, Osaka (JP)

(73) Assignee: Onkyo Corporation, Osaka (JP)

( * ) Notice: Subject to any disclaimer, the term of this patent is extended or adjusted under 35 U.S.C. 154(b) by 38 days.

(21) Appl. No.: 15/354,168

(22) Filed: Nov. 17, 2016

(65) Prior Publication Data

US 2017/0164134 A1 Jun. 8, 2017

(30) Foreign Application Priority Data

Dec. 7, 2015 (JP) ................................ 2015-238756

(51) Int. Cl.
*H03G 5/00* (2006.01)
*H04S 7/00* (2006.01)
*H04R 5/02* (2006.01)

(52) U.S. Cl.
CPC .............. *H04S 7/305* (2013.01); *H04S 7/301* (2013.01); *H04S 7/307* (2013.01); *H04R 5/02* (2013.01)

(58) Field of Classification Search
CPC ........... H04S 7/301; H04S 7/305; H04S 7/307
USPC ........................................................... 381/98
See application file for complete search history.

(56) References Cited

U.S. PATENT DOCUMENTS 5,649,019 A 7/1997 Thomasson
6,801,628 B1 * 10/2004 Thiel ........................ H04S 1/00 381/56
9,154,876 B2 * 10/2015 Ko .......................... H04R 5/02
2004/0190727 A1 9/2004 Bacon
2007/0019815 A1 * 1/2007 Asada .................. H04R 29/00 381/58
2007/0110268 A1 * 5/2007 Konagai ................ H04R 3/12 381/335

(Continued)

FOREIGN PATENT DOCUMENTS

JP 2005-159518 A 6/2005
JP 2009-077379 A 4/2009

OTHER PUBLICATIONS

Math Open Reference, "Solving an isosceles triangle", Dec. 1, 2008.*

*Primary Examiner* — Katherine A Faley
(74) *Attorney, Agent, or Firm* — Renner, Otto, Boisselle & Sklar, LLP

(57) ABSTRACT

To resolve a problem that a listener feels that sense of localization and sense of connecting with the other channels are lost in case that the listener listens to an audio that is output from a ceiling reflection type speaker in an audio processing device that outputs an analog audio signal to speakers including the ceiling reflection type speaker that makes the audio reflect at a ceiling.

A DSP 5 performs low-pass filter processing that extracts low frequency component from a digital audio signal, high-pass filter processing that extracts high frequency component from the digital audio signal, delay processing that delays the low frequency component of the digital audio signal that is extracted by the low-pass filter processing, and composition processing that composes the low frequency component of the digital audio signal that is delayed by the delay processing and the high frequency component of the digital audio signal that is extracted by the high-pass filter processing as audio signal processing.

7 Claims, 4 Drawing Sheets

(56) References Cited

U.S. PATENT DOCUMENTS

| | | | | |
|---|---|---|---|---|
| 2007/0127738 | A1* | 6/2007 | Yamada | H04R 3/04<br>381/98 |
| 2012/0321105 | A1* | 12/2012 | McGrath | G10L 19/008<br>381/119 |
| 2017/0070837 | A1* | 3/2017 | De Poortere | H04S 7/302 |

* cited by examiner

AUDIO PROCESSING DEVICE FOR A CEILING REFLECTION TYPE SPEAKER

BACKGROUND OF THE INVENTION

1. Field of the Invention

The present invention relates to an audio processing device that performs audio signal processing to a digital audio signal.

2. Description of the Related Art

There is an audio processing device that performs audio signal processing such as D/A conversion and amplification to a digital audio signal. Some of the audio processing devices output an analog audio signal to multiple speakers including a speaker that is provided at a ceiling. (For example, see JP 2009-077379 A.) In recent years, there are cases where a ceiling reflection type speaker that reproduces an audio toward the ceiling is provided instead of the speaker that is provided at the ceiling because providing the speaker at the ceiling is expensive. The audio that is reproduced by the ceiling reflection type speaker reflects at the ceiling and arrives at a listener.

With a ceiling reflection type speaker, the frequency bands which sound better to the listener via a direct route (e.g., a route via which the audio arrives at the listener directly from the ceiling reflection type speaker) and a reflected route (e.g., a route via which the audio arrives at the listener after being reflected at the ceiling) are different. In the direct route, the frequency band of audio that is not more than a predetermined frequency becomes superior. In the reflected route, the frequency band of audio that is not less than a predetermined frequency becomes superior. Therefore, time lag of route difference between the direct route and the reflected route occurs between the audio of low frequency and the audio of high frequency. For this reason, when the listener listens to the audio that is output from the ceiling reflection type speaker, the listener loses a sense of the localization of the audio output and the relationship with the audio output from the other channels.

SUMMARY OF THE INVENTION

An objective of the present invention is to resolve a problem that a listener feels that sense of localization and sense of connecting with the other channels are lost in case that the listener listens to an audio that is output from a ceiling reflection type speaker in an audio processing device that output an analog audio signal to speakers including the ceiling reflection type speaker that makes an audio reflect at a ceiling.

An audio processing device that outputs an analog audio signal to speakers including a ceiling reflection type speaker that reproduces an audio toward a ceiling comprising: a digital signal processor that performs audio signal processing against a digital audio signal; and a D/A converter that converts the digital audio signal that is output from the digital signal processor into an analog audio signal, wherein the digital signal processor performs low-pass filter processing that extracts low frequency component from the digital audio signal, high-pass filter processing that extracts high frequency component from the digital audio signal, delay processing that delays the low frequency component of the digital audio signal that is extracted by the low-pass filter processing, and composition processing that composes the low frequency component of the digital audio signal that is delayed by the delay processing and high frequency component of the digital audio signal that is extracted by the high-pass filter processing toward the digital audio signal as the audio signal processing.

In the present invention, low frequency component of a digital audio signal that is delayed by delay processing and high frequency component of the digital audio signal that is extracted by high-pass filter processing are composed. Then, a composed digital audio signal is converted into an analog audio signal and the analog audio signal is output to a ceiling reflection type speaker. Therefore, time lag that occurs from arrival route difference between an audio of low frequency and the audio of high frequency is resolved. Due to this, a problem that a listener feels that sense of localization and sense of connecting with the other channels are lost can be resolved.

Preferably, wherein the digital signal processor delays the low frequency component of the digital audio signal with time difference between time that an audio arrives at a listener after reflecting at the ceiling from the ceiling reflection type speaker and time that the audio arrives from the ceiling reflection type speaker at the listener directly in the delay processing.

Preferably, wherein the digital signal processor performs calculation of (Lr −Ld)/Vs so as to calculate the time difference in case that the distance of a reflected route that the audio arrives at the listener after reflecting at the ceiling from the ceiling reflection type speaker is "Lr", the distance of a direct route that the audio arrives from the ceiling reflection type speaker at the listener directly is "Ld", and sound speed is "Vs".

Preferably, wherein the digital signal processor measures the distance of the direct route "Ld" by sound field correction.

Preferably, wherein the digital signal processor performs calculation of "$2\times(Lc^2+(Ld/2)^2))^{1/2}$" so as to calculate the distance of the reflected route "Lr" in case that the distance from the ceiling reflection type speaker to the ceiling is "Lc".

Preferably, further comprising: a controller that receives setting of the distance to the ceiling "Lc".

Preferably, wherein the digital audio processor extracts low frequency component not more than 2.5 kHz from the digital audio signal in the low-pass filter processing and extracts high frequency component not less than 2.5 kHz from the digital audio signal in the high-pass filter processing.

An audio processing device that outputs an analog audio signal to a ceiling reflection type speaker that reproduces an audio toward a ceiling comprising: a digital signal processor that performs audio signal processing against a digital audio signal; and a D/A converter that converts the digital audio signal that is output from the digital signal processor into an analog audio signal, wherein the digital signal processor performs low-pass filter processing that extracts low frequency component from the digital audio signal, high-pass filter processing that extracts high frequency component from the digital audio signal, delay processing that delays the low frequency component of the digital audio signal that is extracted by the low-pass filter processing, and composition processing that composes the low frequency component of the digital audio signal that is delayed by the delay processing and the high frequency component of the digital audio signal that is extracted by the high-pass filter processing as the audio signal processing.

According to the present invention, a problem that a listener feels that sense of localization and sense of connecting with the other channels are lost can be resolved.

DETAILED DESCRIPTION OF THE PREFERRED EMBODIMENTS

Figure 1:
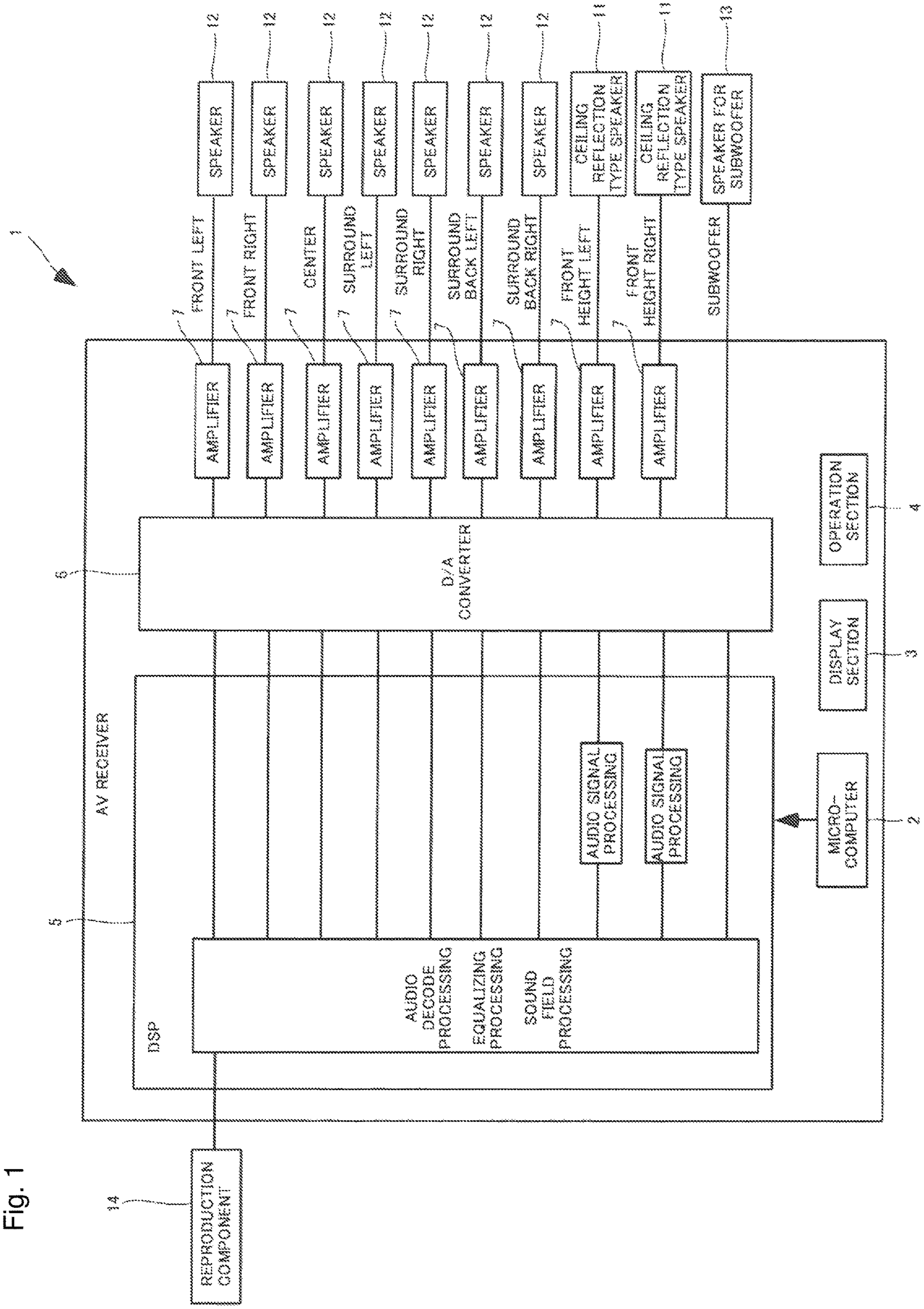
FIG. 1 is a block diagram illustrating a configuration of an AV receiver according to an embodiment of the present invention.

An embodiment of the present invention is described below. FIG. 1 is a block diagram illustrating a configuration of an AV receiver according to an embodiment of the present invention. An AV receiver 1 (an audio processing device) outputs an analog audio signal to multiple speakers including a ceiling reflection type speaker 11 that reproduces an audio toward a ceiling. For example, a reproduction component 14 such as Blu-ray (registered trademark) player is connected to the AV receiver 1. As illustrated in FIG. 1, the AV receiver 1 includes a microcomputer 2, a display section 3, an operation section 4, a DSP (Digital Signal Processor) 5, a D/A converter 6, and an amplifier 7. The AV receiver 1 can perform video signal processing to a digital video signal so as to output a video signal to a television receiver in addition to a digital audio signal. In the present embodiment, the configuration of the AV receiver 1 related to audio signal processing to the digital audio signal is described.

The microcomputer 2 (a controller) controls respective sections composing the AV receiver 1. The display section 3 displays a setting screen, volume level and so on. The display section 3 is configured by a LCD (Liquid Crystal Display), a fluorescence display tube, and so on. The operation section 4 is for receiving user operation. The operation section 4 is configured by operation buttons that are provided at an enclosure of the AV receiver 1, and a remote controller.

The DSP 5 (a digital signal processor) performs the audio signal processing such as audio decode processing that generates a multiple channels digital audio signal from the digital audio signal that is output from the reproduction component 14, equalizing processing, and sound field processing.

Herein, for example, a 7.1 channels digital audio signal and a 2 channels digital audio signal for the ceiling reflection type speaker 11 are included in the multiple channels digital audio signal (7.1.2 channels). A front left, a front right, a center, a subwoofer, a surround left, a surround right, a surround back left, and a surround back right digital audio signal are included in the 7.1 channels digital audio signal. The 7.1 channels digital audio signal is for the speaker 12 and the subwoofer speaker 13 that are not speakers of type that output the audio toward the ceiling. In other words, the 7.1 channels digital audio signal is for the speaker 12 and the subwoofer speaker 13 that reproduce the audio toward the listener directly. Sound emission direction of the speaker that reproduces the audio toward the listener directly is almost a horizontal direction. The 2 channels digital audio signal for the ceiling reflection type speaker 11 is a height channel digital audio signal. Front height left and front height right digital audio signals are included in a 2 channel digital audio signal for the ceiling reflection type speaker 11.

Low-pass filter (hereinafter referred as to "LPF") processing that the DSP 5 performs is described later. The D/A converter 6 D/A-converts the digital audio signal into the analog audio signal.

The amplifier 7 amplifies the analog audio signal into which the D/A convert 6 D/A-converts. The amplifier 7 amplifies front left, front right, center, surround left, surround right, surround back left, surround back right, front height left, and front height right analog audio signals respectively.

The front left analog audio signal that the amplifier 7 amplifies is output to the speaker 12 for the front left. The front right analog audio signal that the amplifier 7 amplifies is output to the speaker 12 for the front right. The center analog audio signal that the amplifier 7 amplifies is output to the speaker 12 for the center. The surround left analog audio signal that the amplifier 7 amplifies is output to the speaker 12 for the surround left. The surround right analog audio signal that the amplifier 7 amplifies is output to the speaker 12 for the surround right.

The surround back left analog audio signal that the amplifier 7 amplifies is output to the speaker 12 for the surround back left. The surround back right analog audio signal that the amplifier 7 amplifies is output to the speaker 12 for the surround back right. The front height left analog audio signal that the amplifier 7 amplifies is output to the ceiling reflection type speaker 11 for the front height left. The front height right analog audio signal that the amplifier 7 amplifies is output to the ceiling reflection type speaker 11 for the front height right. The subwoofer analog audio signal into which the D/A converter 6 D/A-converts is output to the subwoofer speaker 13.

Figure 2:
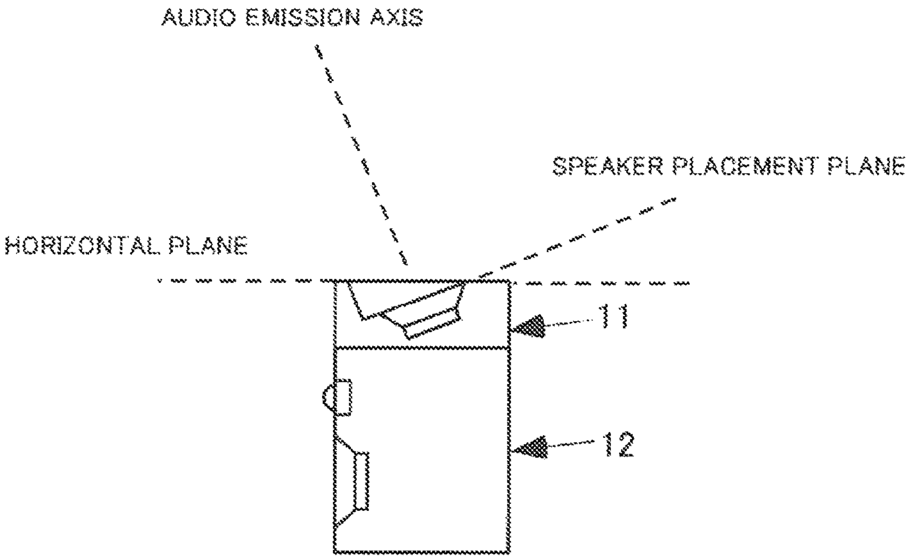
FIG. 2 is a side view illustrating a ceiling reflection type speaker schematically.

FIG. 2 is a side view illustrating the ceiling reflection type speaker 11 schematically. The ceiling reflection type speaker 11 is put on the speaker 12 that reproduces the audio toward the listener directly and used on it. For example, the ceiling reflection type speaker 11 for the front height left is put on the speaker 12 for the front left and used on it. Further, the ceiling reflection type speaker 11 for the front height right is put on the speaker 12 for the front right and used on it. The ceiling reflection type speaker 11 may be put on the speaker 12 for the surround left and used as the speaker for rear height left. The ceiling reflection type speaker 11 may be put on the speaker 12 for the surround right and used as the speaker for rear height right. Sound emission direction of the speaker 12 is almost a horizontal direction.

Next, the LPF processing, high-pass filter (hereinafter referred as to "HPF") processing, delay processing and composition processing by the DSP 5 are described. The LPF processing, the HPF processing, the delay processing, and the composition processing by the DSP 5 are performed against the digital audio signal for the ceiling reflection type speaker 11. The LPF processing, the HPF processing, the delay processing, and the composition processing by the DSP 5 are not performed against the digital audio signal (for example, 7.1 channels audio signal) for the speaker 12 and the subwoofer speaker 13 other than the ceiling reflection type speaker 11.

Figure 3:
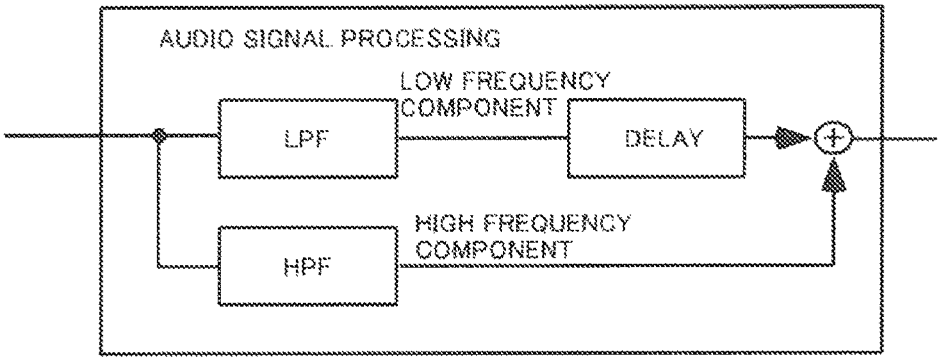
FIG. 3 is a diagram illustrating audio signal processing that is performed against a digital audio signal for the ceiling reflection type speaker by a DSP.

FIG. 3 is a diagram illustrating the audio signal processing that is performed against the digital audio signal for the ceiling reflection type speaker 11 by the DSP 5. The DSP 5 performs the LPF processing that extracts low frequency component from the digital audio signal for the ceiling reflection type speaker 11. Concretely, the DSP 5 extracts the low frequency component not more than 2.5 kHz from the digital audio signal. Further, the DSP 5 performs the HPF processing that extracts high frequency component form digital audio signal. Concretely, the DSP 5 extracts the high frequency component not less than 2.5 kHz from the digital audio signal.

The DSP 5 performs the delay processing that delays the low frequency component of the digital audio signal that is extracted by the LPF processing. Concretely, the DSP 5 delays the low frequency component of the digital audio signal with time difference (delay time) between time that the audio arrives at the listener after reflecting at the ceiling from the ceiling reflection type speaker 11 and time that the audio arrives from the ceiling reflection type speaker 11 at the listener directly.

Figure 4:
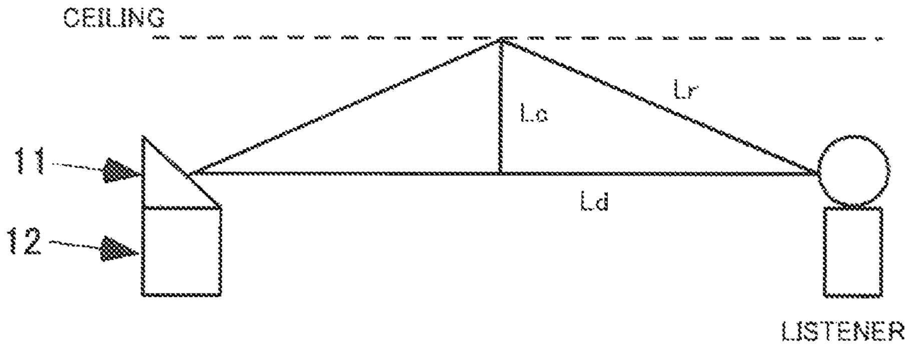
FIG. 4 is a diagram that is for describing delay time (time difference) by the distance difference between reflected route and direct route.

FIG. 4 is a diagram that is for describing delay time (time difference) by the distance difference between a reflected route and a direct route. The reflected route is a route that the audio arrives at the listener after reflecting at the ceiling from the ceiling reflection type speaker 11. The direct route is a route that the audio arrives from the ceiling reflection type speaker 11 at the listener directly. Distance of the reflected route is "Lr". Distance of the direct route is "Ld". Sound speed is Vs=340 [m/s]. Delay time is "Dta". The DSP 5 performs calculation of Dta=(Lr−Ld)/Vs [m/s] so as to calculate the delay time (the time difference).

The DSP 5 measures the distance of the direct route "Ld" by sound field correction. The sound field correction is performed by the DSP 5 after measuring test tone by a microphone. In case that the sound field correction is not performed by the DSP 5, default value (for example, general distance between the ceiling reflection type speaker 11 and the listener) is used as the distance of the direct route "Ld".

In case that the distance from the ceiling reflection type speaker 11 to the ceiling is "Lc", the DSP 5 performs calculation of "$Lr=2\times((Lc^2+(Ld/2)^2))^{1/2}$" so as to calculate the distance of the reflected route "Lr". Herein, the microcomputer 2 receives setting of the distance to the ceiling "Lc" via the operation section 4. For example, the microcomputer 2 displays OSD (On Screen Display) that the distance to the ceiling "Lc" can be input at the television receiver and receives setting of the distance to the ceiling "Lc" that is input by a remote controller before measuring the test tone. In case that the microcomputer 2 does not receive the distance to the ceiling "Lc", default value (for example, the distance "Lc" from the ceiling reflection type speaker 11 to the ceiling of average height) is used as the distance to the ceiling "Lc".

In case that the distance from the ceiling reflection type speaker 11 to the ceiling "Lc" is 1.70 [m] and the distance of the direct route "Ld" is 2.10 [m], the distance of the reflected route "Lr" is 4.00 [m]. Then, the delay time Dta is (4.00−2.10)/340=5.58 [ms].

The DSP 5 performs the composition processing that composes the low frequency component of the digital audio signal that is delayed by the delay processing and the high frequency component of the digital audio signal that is extracted by the HPF processing. The digital audio signal that is composed by the composition processing is output to the D/A converter 6. The D/A converter 6 converts the digital audio signal that is output from the DSP 5 into the analog audio signal. The analog audio signal that is D/A-converted by the D/A converter 6 is output to the ceiling reflection type speaker 11. The ceiling reflection type speaker 11 reproduces the audio based on the analog audio signal that is output from the D/A converter 6.

As described in the above, in the present embodiment, low frequency component of the digital audio signal that is delayed by the delay processing and high frequency component of the digital audio signal that is extracted by the HPF processing are composed. Then, a composed digital audio signal is converted into the analog audio signal and the analog audio signal is output to the ceiling reflection type speaker 11. Therefore, time lag that occurs from arrival route difference between the audio of low frequency and the audio of high frequency is resolved. Due to this, a problem that the listener feels that sense of localization and sense of connecting with the other channels are lost can be resolved.

The embodiment of the present invention is described above, but the mode to which the present invention is applicable is not limited to the above embodiment and can be suitably varied without departing from the scope of the present invention.

In the above mentioned embodiment, the DSP 5 extracts low frequency component not more than 2.5 kHz from the digital audio signal in the LPF processing. Low frequency component that is extracted in the LPF processing is not limited to component not more than 2.5 kHz and may be other frequency band. Further, the DSP 5 extracts high frequency component not less than 2.5 kHz from the digital audio signal in the HPF processing. High frequency component that is extracted in the HPF processing is not limited to component not less than 2.5 k kHz and may be other frequency band.

In the above mentioned embodiment, the AV receiver is illustrated as an audio processing device. Not limited to this, it may be the other audio processing device.

The present invention can be suitably employed in the audio processing device that performs audio signal processing to the digital audio signal.

What is claimed is:

1. An audio processing device that outputs an analog audio signal to speakers including at least one ceiling reflection type speaker that reproduces an audio toward a ceiling, and at least one non-ceiling reflection type speaker, comprising:

a digital signal processor that performs audio signal processing on a digital audio signal, the digital audio signal including at least one non-ceiling reflection type speaker signal and at least one ceiling reflection type speaker signal; and a digital to analog (D/A) converter that converts the digital audio signal, including the at least one non-ceiling reflection type speaker signal and the at least one ceiling reflection type speaker signal, which has been processed by the digital signal processor into an analog audio signal, wherein only for the at least one ceiling reflection type speaker the digital signal processor performs low-pass filtering that extracts a low frequency component from the digital audio signal, high-pass filtering that extracts a high frequency component from the digital audio signal, delay processing that delays only the low frequency component of the digital audio signal that is extracted by the low-pass filtering, and composition processing that composes the low frequency component of the digital audio signal that is delayed by the delay processing and the high frequency component of the digital audio signal that is extracted by the high-pass filtering as the audio signal processing;

wherein the digital signal processor delays only the low frequency component of the digital audio signal with a time difference between time that an audio arrives at a listener after reflecting at the ceiling from the at least one ceiling reflection type speaker and time that an audio arrives from the at least one ceiling reflection type speaker at the listener directly in the delay processing, wherein the at least one non-ceiling reflection type speaker is undelayed relative to the at least one ceiling reflection type speaker.

2. The audio processing device according to claim 1, wherein the digital signal processor performs calculation of (Lr−Ld)/Vs so as to calculate the time difference wherein a distance of a reflected route that the audio arrives at the listener after reflecting at the ceiling from the ceiling reflection type speaker is "Lr", the distance of a direct route that the audio arrives from the ceiling reflection type speaker at the listener directly is "Ld", and sound speed is "Vs".

3. The audio processing device according to claim 2, wherein the digital signal processor measures the distance of the direct route "Ld" by sound field correction.

4. The audio processing device according to claim 2, wherein the digital signal processor performs calculation of $2\times(Lc^2+(Ld/2)^2))^{1/2}$ so as to calculate the distance of the reflected route "Lr" wherein the shortest distance from the ceiling reflection type speaker to the ceiling is "Lc".

5. The audio processing device according to claim 4, further comprising: a controller that receives setting of the distance to the ceiling "Lc".

6. The audio processing device according to claim 1, wherein the digital audio processor extracts the low frequency component not more than 2.5 kHz from the digital audio signal in the low-pass filtering and extracts the high frequency component not less than 2.5 kHz from the digital audio signal in the high-pass filtering.

7. The audio processing device of claim 1, wherein the high frequency component of the digital audio signal, which is composed with the low frequency component of the digital audio signal, is undelayed relative to the low frequency component of the digital audio signal.

* * * * *